United States Patent
Haginiwa

(10) Patent No.: US 7,312,873 B2
(45) Date of Patent: Dec. 25, 2007

(54) ALIGNMENT METHOD AND PARAMETER SELECTION METHOD

(75) Inventor: Kuniyasu Haginiwa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/195,836

(22) Filed: Aug. 3, 2005

(65) Prior Publication Data

US 2005/0264814 A1 Dec. 1, 2005

Related U.S. Application Data

(62) Division of application No. 10/330,082, filed on Dec. 30, 2002, now Pat. No. 6,973,397.

(30) Foreign Application Priority Data

Jan. 8, 2002 (JP) ............................. 2002-001599

(51) Int. Cl.
*G01B 11/00* (2006.01)

(52) U.S. Cl. .................................................. 356/401

(58) Field of Classification Search .................. None
See application file for complete search history.

(56) References Cited

U.S. PATENT DOCUMENTS

| | | | | |
|---|---|---|---|---|
| 4,531,060 A | * | 7/1985 | Suwa et al. ............... | 250/548 |
| 4,702,606 A | * | 10/1987 | Matsuura et al. .......... | 356/401 |
| 4,860,374 A | * | 8/1989 | Murakami et al. ......... | 382/151 |
| 4,958,082 A | * | 9/1990 | Makinouchi et al. ....... | 250/548 |
| 5,109,430 A | * | 4/1992 | Nishihara et al. .......... | 382/151 |
| 5,260,771 A | * | 11/1993 | Komoriya et al. .......... | 356/401 |
| 5,452,090 A | * | 9/1995 | Progler et al. ............. | 356/401 |
| 5,493,403 A | * | 2/1996 | Nishi ......................... | 356/401 |
| 5,543,921 A | * | 8/1996 | Uzawa et al. .............. | 356/401 |
| 5,594,549 A | * | 1/1997 | Mori et al. ................. | 356/401 |
| 6,034,378 A | * | 3/2000 | Shiraishi ................ | 250/559.29 |
| 6,101,267 A | | 8/2000 | Shiraishi ................... | 382/151 |
| 6,130,751 A | | 10/2000 | Haginiwa et al. .......... | 356/401 |
| 6,333,786 B1 | | 12/2001 | Uzawa et al. .............. | 356/401 |

(Continued)

FOREIGN PATENT DOCUMENTS

JP 63-232321 9/1988

(Continued)

*Primary Examiner*—Gregory J. Toatley, Jr.
*Assistant Examiner*—Gordon J. Stock, Jr.
(74) *Attorney, Agent, or Firm*—Fitzpatrick, Cella, Harper & Scinto

(57) ABSTRACT

A method of aligning an object including steps of detecting an image of a mark on the object with respect to each of a plurality of areas on the object, obtaining a position of the mark based on the detected image with respect to each image detected in the detecting step, extracting a feature of the mark based on the detected image with respect to each image detected in the detecting step, determining a correction value based on previously prepared information to relate the extracted feature to the correction value, with respect to each position obtained in the obtaining step, correcting the obtained position based on the correction value with respect to each position obtained in the obtaining step, and calculating a position of each of a plurality of areas on the object based on positions corrected in the correcting step.

5 Claims, 12 Drawing Sheets

U.S. PATENT DOCUMENTS

| | | | |
|---|---|---|---|
| 6,567,713 B2 | 5/2003 | Lichtenstein et al. | 700/58 |
| 6,668,075 B1 * | 12/2003 | Nakamura et al. | 382/144 |
| 7,038,777 B2 * | 5/2006 | Kim et al. | 356/401 |
| 7,106,444 B2 * | 9/2006 | Nakajima | 356/401 |

FOREIGN PATENT DOCUMENTS

| | | |
|---|---|---|
| JP | 4-3413 | 1/1992 |
| JP | 5-335212 | 12/1993 |

* cited by examiner

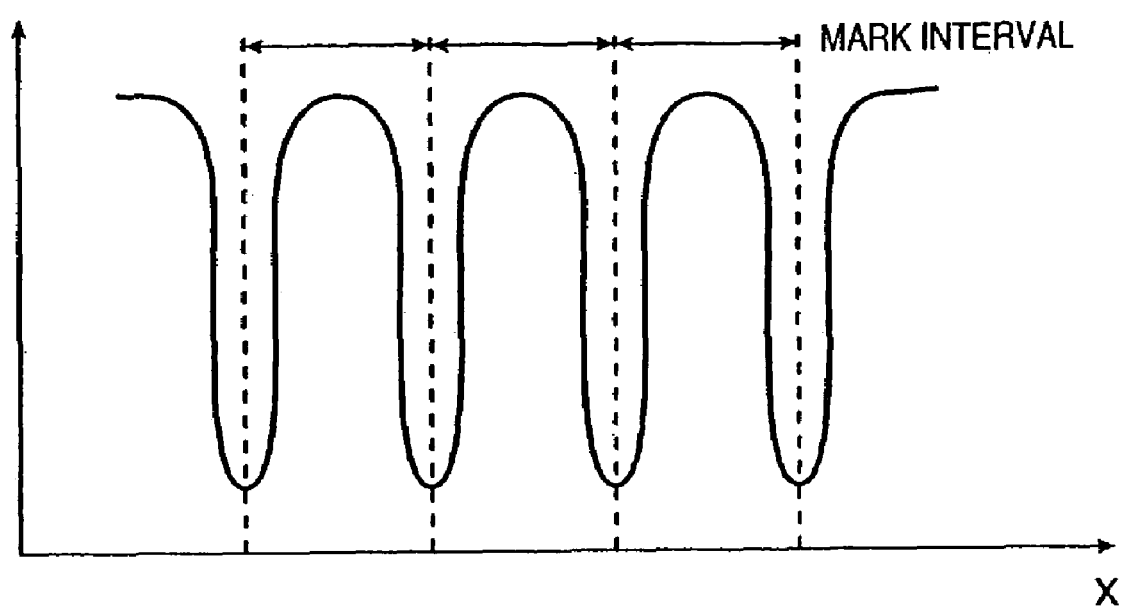
F I G. 6

F I G. 10
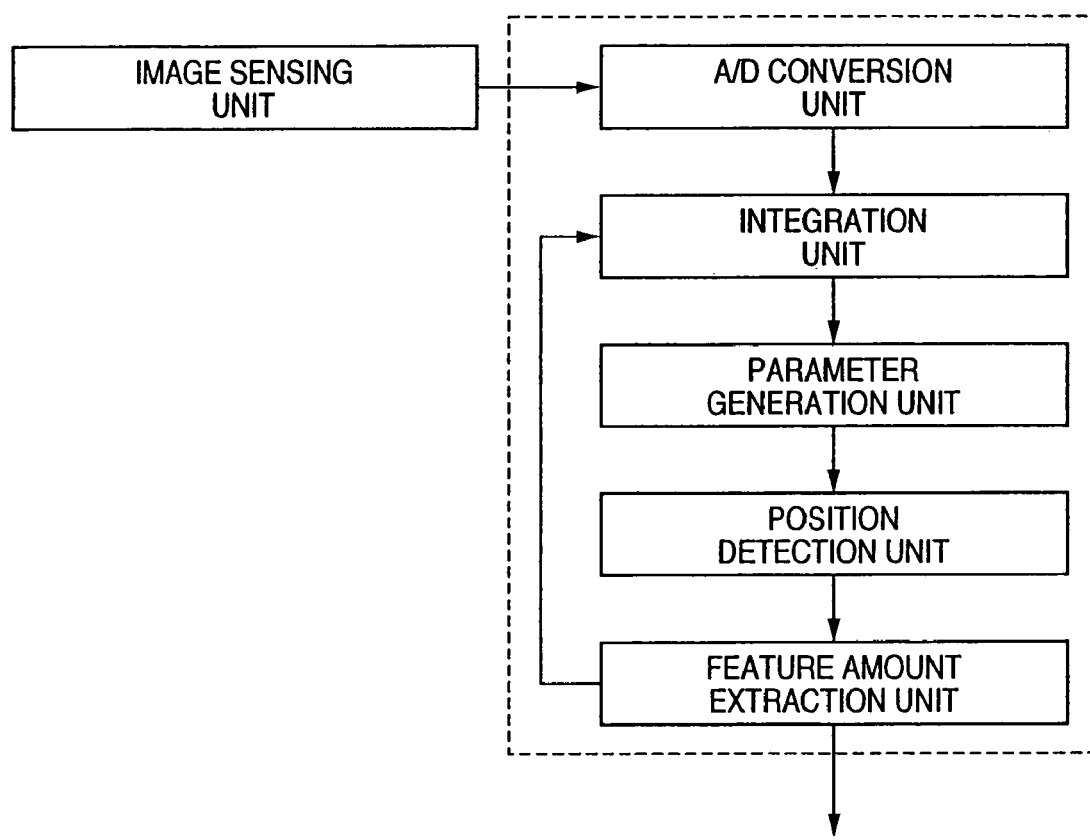

ALIGNMENT METHOD AND PARAMETER SELECTION METHOD

This application is a divisional application of U.S. patent application Ser. No. 10/330,082, filed Dec. 30, 2002, now U.S. Pat. No. 6,973,397.

FIELD OF THE INVENTION

The present invention relates to an alignment method and a parameter selection method, which can be applied to position measurement of a wafer, a mask, or some parts (a stage and the like) of a semiconductor exposure apparatus for projecting and exposing an electronic circuit pattern onto a semiconductor substrate and are used for accurate alignment such as relative alignment between a wafer and a mask or between a mask and an apparatus reference position or an apparatus component.

BACKGROUND OF THE INVENTION

As a method of measuring the positions or positional errors of several shot areas on a semiconductor wafer in a step-and-repeat exposure apparatus, i.e., a so-called stepper for semiconductor manufacturing, determining the shot order of the respective shot areas on the wafer in accordance with the measurement result, and sequentially aligning the respective shot areas on the wafer to the reticle position on the basis of the determined shot order, a technique disclosed in, e.g., Japanese Patent Laid-Open No. 63-232321 already filed by the present applicant is known. For more accurate alignment, methods of evaluating an alignment waveform using its contrast or symmetry and selecting an alignment detection means on the basis of the evaluation result are disclosed in Japanese Patent Laid-Open Nos. 5-335212 and 4-3413 already filed by the present applicant.

Generally, a semiconductor element is formed by a plurality of processes. For this reason, the optical characteristic of an alignment mark changes for each process depending on the wafer underlying substance, alignment mark step, or a change in covering or film thickness of a photosensitive material (resist). In a conventional alignment method, a plurality of alignment means are prepared to cope with such changes. The alignment means are appropriately selected, and process parameters for alignment mark detection are fixed or manually input to cope with the changes. Selecting the alignment means or alignment parameters is very time-consuming. In addition, optimum alignment means or alignment parameters are not always selected.

Even when an alignment method is automatically selected, and an alignment waveform is evaluated, as in the above prior art, the apparatus must have a plurality of detection means in advance to do accurate alignment. This increases the apparatus cost, complicates the apparatus maintenance, and generates an offset due to an error factor that changes depending on the detection means. For these reasons, this method is not an all-round method for accurate detection.

SUMMARY OF THE INVENTION

The present invention has, therefore, been made in consideration of the above-described problems, and has as its object to provide an alignment method and a parameter selection method, which can execute accurate alignment using only one kind of alignment detection apparatus.

In order to solve the above-described problems and achieve the object, according to the present invention, there is provided an alignment method of aligning an object to be aligned by measuring an alignment mark position on the object, characterized by comprising detecting the alignment mark on the object, obtaining position data of the alignment mark on the basis of the detected mark information, extracting a feature amount of the alignment mark on the basis of the mark information, obtaining a correction value of the position data on the basis of the extracted feature amount of the alignment mark, and aligning the object on the basis of position information corrected using the correction value.

According to the present invention, there is also provided a parameter selection method used for an alignment method of aligning an object to be aligned by measuring an alignment mark position on the object, characterized by comprising detecting the alignment mark on the object, obtaining position data of the alignment mark on the basis of the detected mark information, extracting a feature amount of the alignment mark on the basis of the mark information, changing a process parameter in detection of the alignment mark on the basis of the extracted feature amount of the alignment mark, and selecting an optimum process parameter on the basis of the change in feature amount of the alignment mark.

An exposure apparatus according to the first aspect of the present invention is characterized in that exposure is executed by aligning a wafer using the above alignment method.

An exposure apparatus according to the second aspect of the present invention is characterized in that exposure is executed by aligning a wafer using the above parameter selection method.

A device manufacturing method according to the present invention is characterized in that a circuit pattern is formed by executing exposure by aligning a wafer using the above exposure apparatus.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 6 is a graph for explaining the mark interval;

FIG. 10 is a schematic view of a mark detection portion and a feature amount extraction portion;

DETAILED DESCRIPTION OF THE PREFERRED EMBODIMENTS

The preferred embodiments of the present invention will be described below.

The outline of the embodiments will be described first.

In the embodiments, the feature amount of an alignment mark is extracted using one of the following three feature amount extraction methods at the time of alignment mark position detection. With this process, the mark measurement value can be corrected or a parameter to be used for mark detection can be changed before wafer correction based on a position measurement result. Hence, mark detection can be executed at a high measurement accuracy. This makes it possible to do highly accurate alignment and increase the productivity.

Figure 1:
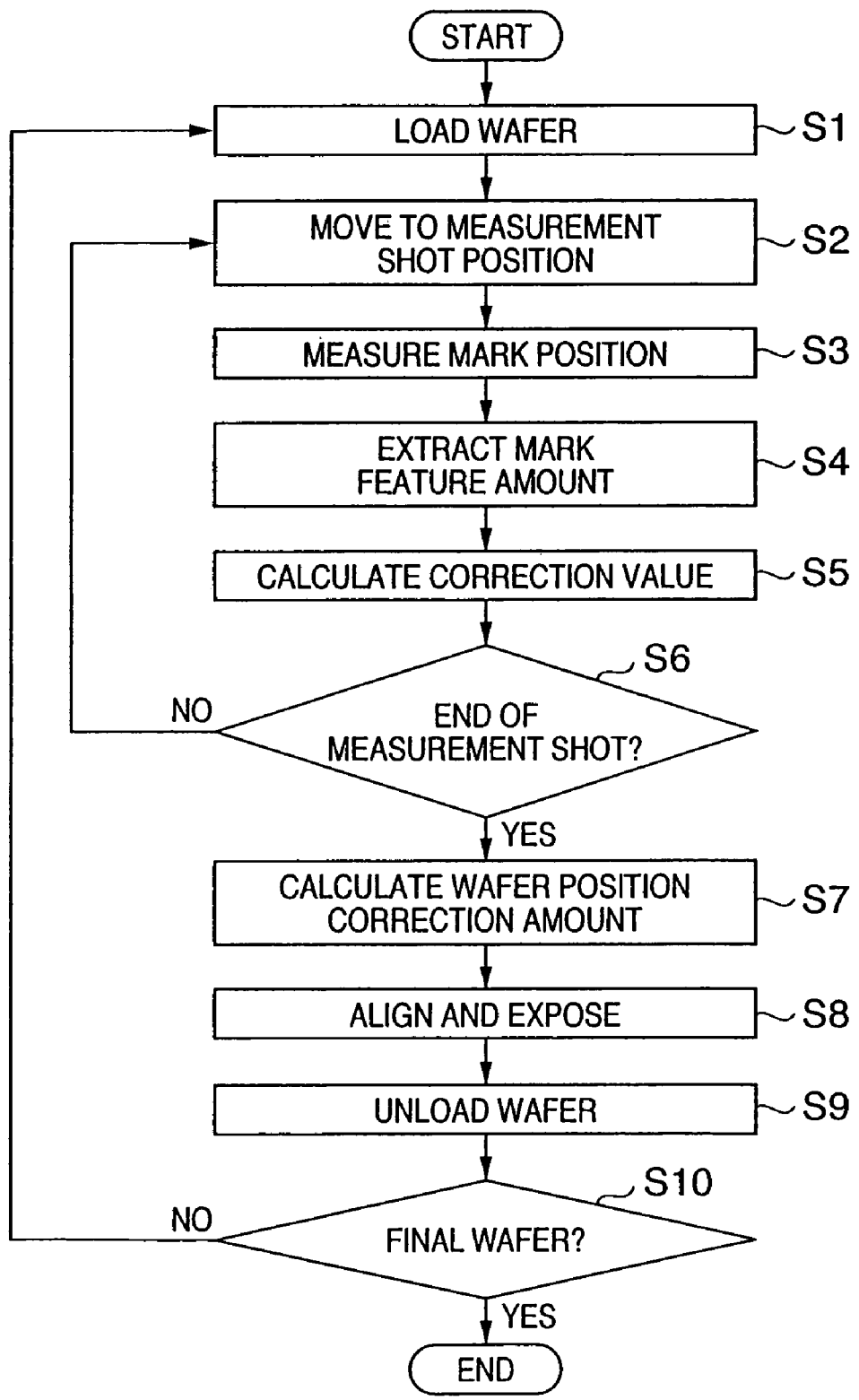
FIG. 1 is a flow chart showing alignment and exposure process procedures of the first embodiment.
Figure 2:
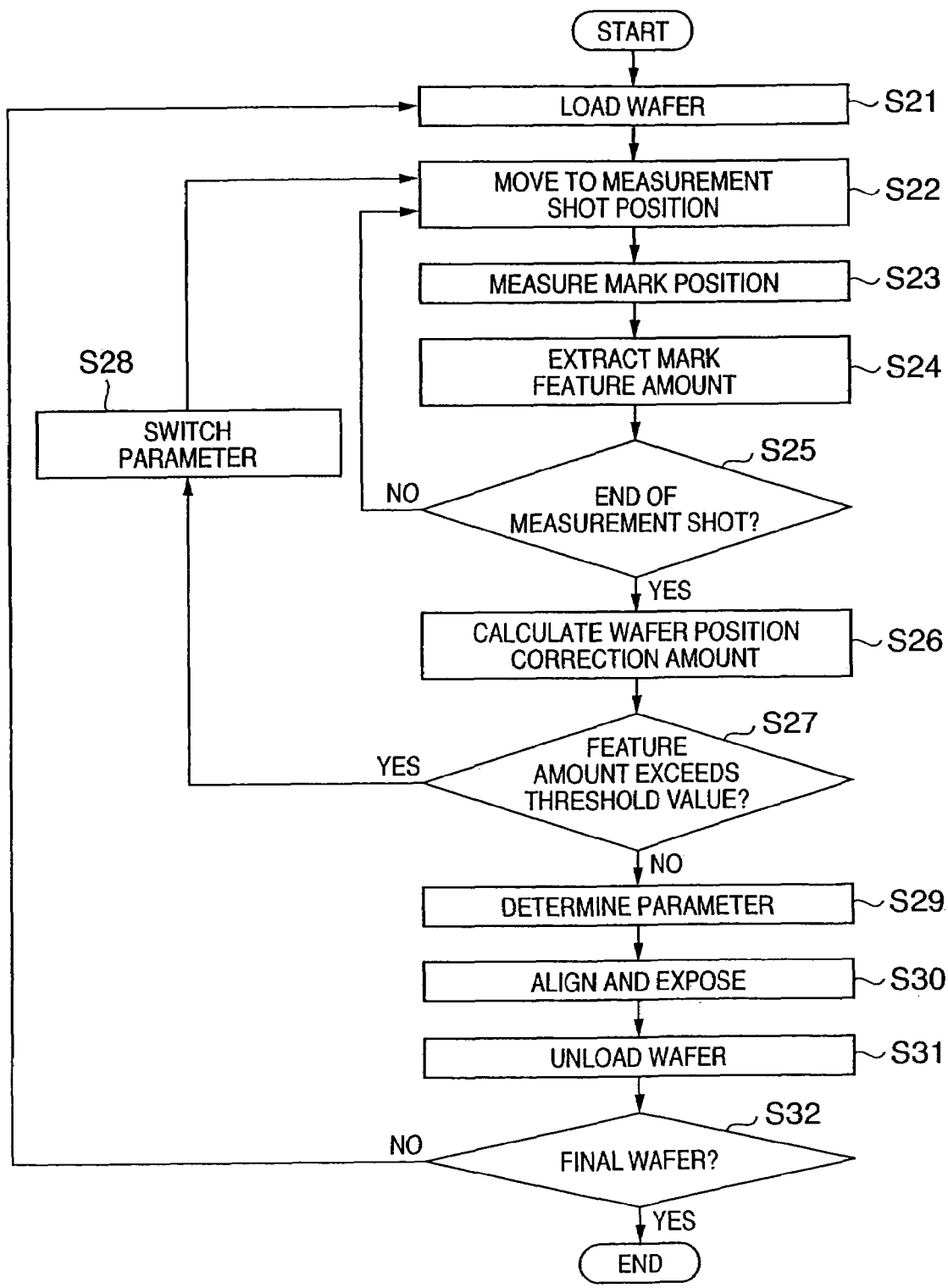
FIG. 2 is a flow chart showing alignment and exposure process procedures of the second embodiment.

FIG. 10 is a view for explaining the position detection, feature amount extraction, and parameter optimizing portion in FIGS. 1 and 2.

This portion has an image sensing unit, an A/D conversion unit, an integration unit, a parameter generation unit, and a position detection unit. The parameter generation unit generates a set of parameters for which the effective template range is changed in a significant range and transfers the parameter set to the position detection unit. The feature amount extraction unit extracts a feature amount by one of the following three feature amount extraction methods or a combination thereof.

(First Feature Amount Extraction Method)

Figure 3A:
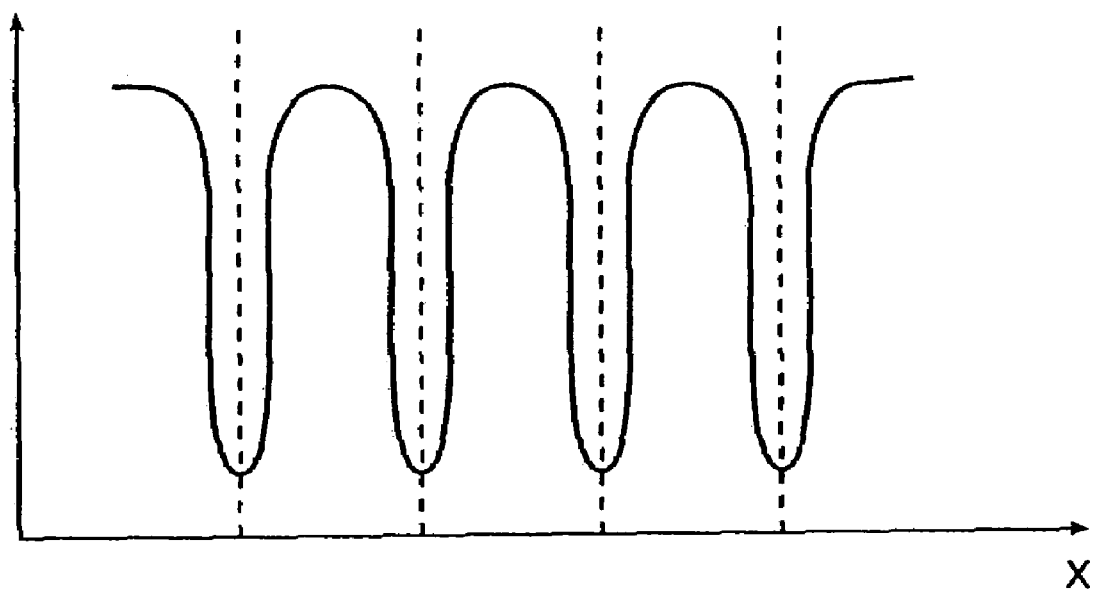
FIGS. 3A and 3B are graphs for explaining mark waveforms to extract a feature amount.
Figure 3B:
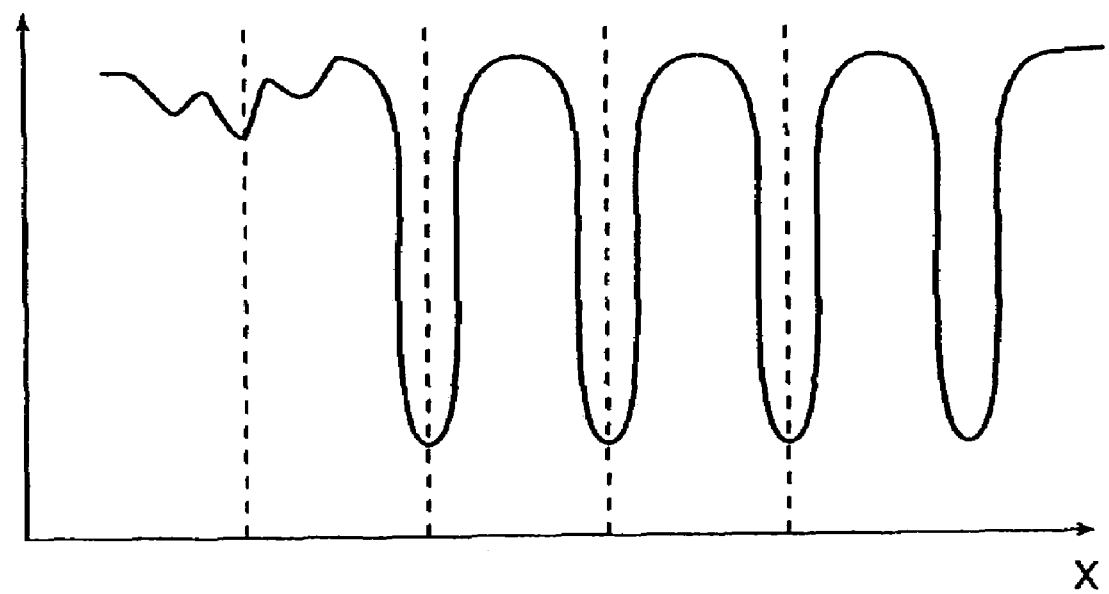
Figure 4:
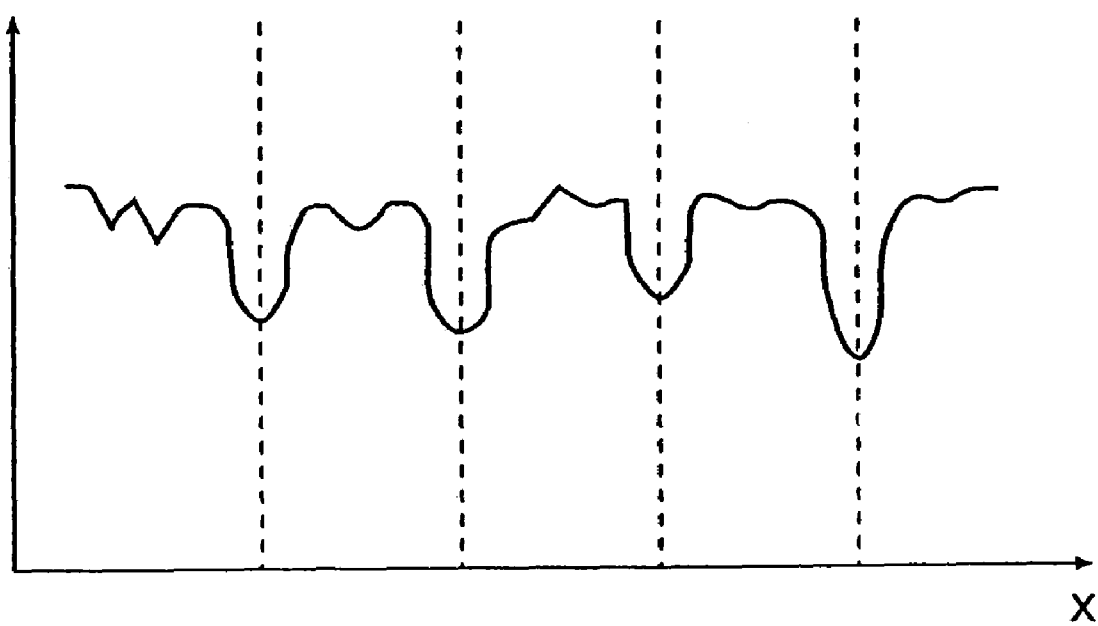
FIG. 4 is a graph for explaining a mark waveform with a low contrast.
Figure 5:
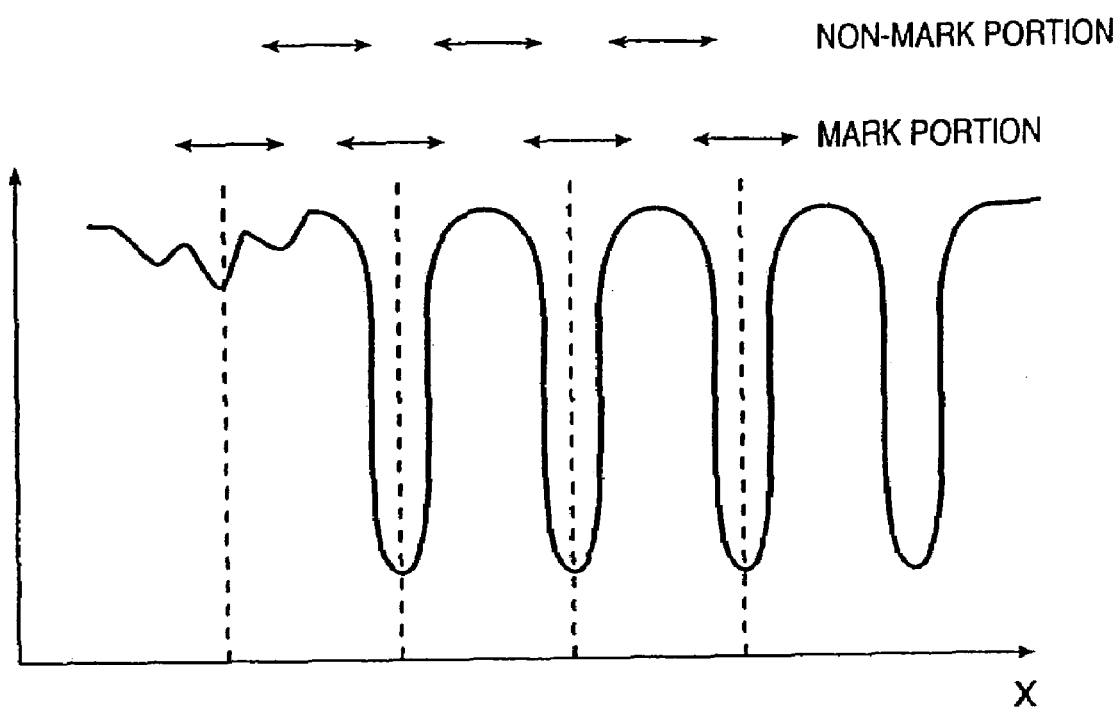
FIG. 5 is a graph for explaining the contrast of the mark waveform.

A degradation in mark measurement accuracy is detected by comparing the contrast of the waveform of a detected mark portion and that of a non-mark portion. FIG. 3A shows a waveform obtained when measurement is normal. FIG. 3B shows a waveform obtained when a measurement error occurs. Each broken line indicates a measurement position of each mark portion of an alignment mark. In an alignment mark having an extremely low contrast at a mark portion, as shown in FIG. 4, the measurement accuracy may degrade because of the influence of the background of the alignment mark. To the contrary, in the embodiments, a measurement error or a degradation in measurement accuracy is detected by comparing the contrast of each mark portion and that of a non-mark portion, as shown in FIG. 5. For example, when the minimum value of the contrast of a mark portion is smaller than the maximum value of the contrast of a non-mark portion, it is detected as a degradation in measurement accuracy.

(Second Feature Amount Extraction Method)

A measurement error or a degradation in measurement accuracy is detected on the basis of the interval between the positions of detected mark portions. More specifically, when a measurement error or a degradation in measurement accuracy of an alignment mark occurs, the interval between mark portions shown in FIG. 6 is supposed to be different from the design value. Hence, a measurement error or a degradation in measurement accuracy is detected on the basis of the interval between mark portions. For example, when the difference between the design value and the measured mark portion interval is larger than a preset threshold value, it is detected as a degradation in accuracy.

(Third Feature Amount Extraction Method)

Figure 7:
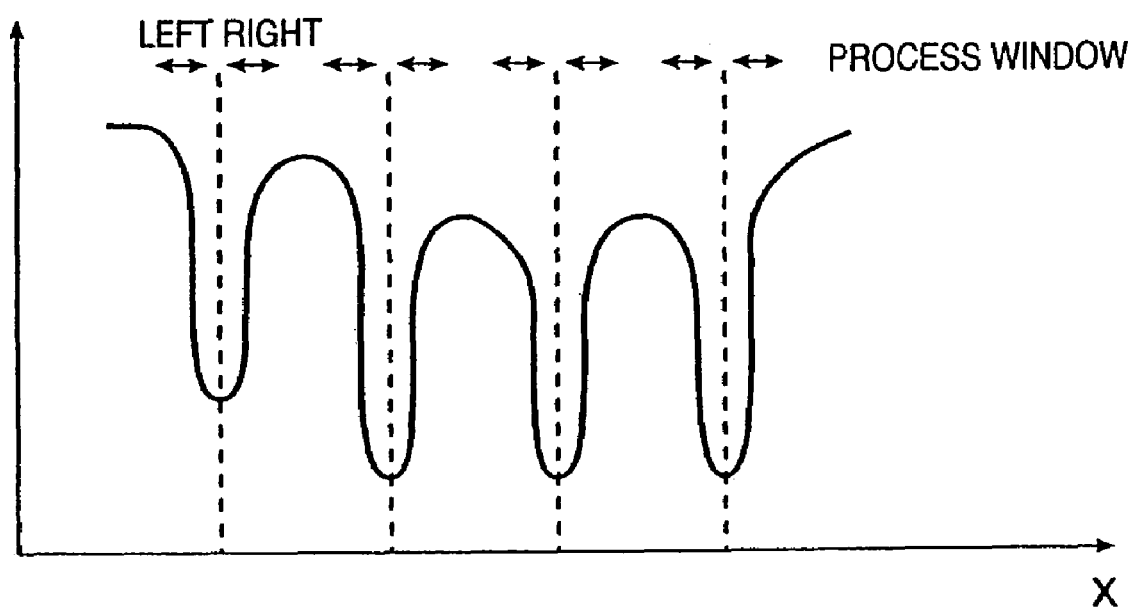
FIG. 7 is a graph for explaining the symmetry interval of the mark waveform.

A degradation in measurement accuracy is detected on the basis of the asymmetry of the waveform of a mark portion. More specifically, when a photoresist applied onto an alignment mark has an non-uniform film thickness, like an alignment mark having an non-uniform step, the waveform shape of each mark portion is asymmetrical, as shown in FIG. 7, and a measurement error occurs, as is known. Hence, a degradation in measurement accuracy is detected by calculating the asymmetry of the waveform of a mark portion.

Any one of the above feature amount detection methods may independently be used, or some of them may be combined. When the methods are combined, detection can be executed, for example, in the following way in accordance with the allowable range of accuracy degradation.

(1) When a degradation in measurement accuracy is detected by any one of the methods, it is determined as a degradation in measurement accuracy.

(2) When a degradation in measurement accuracy is detected by all the methods, it is determined as a degradation in measurement accuracy.

As described above, the embodiments are characterized by comprising the feature amount detection step of, in a semiconductor exposure apparatus or the like, detecting a degradation in measurement accuracy by at least one method using measurement information in measuring the position of each alignment mark.

Figure 8:
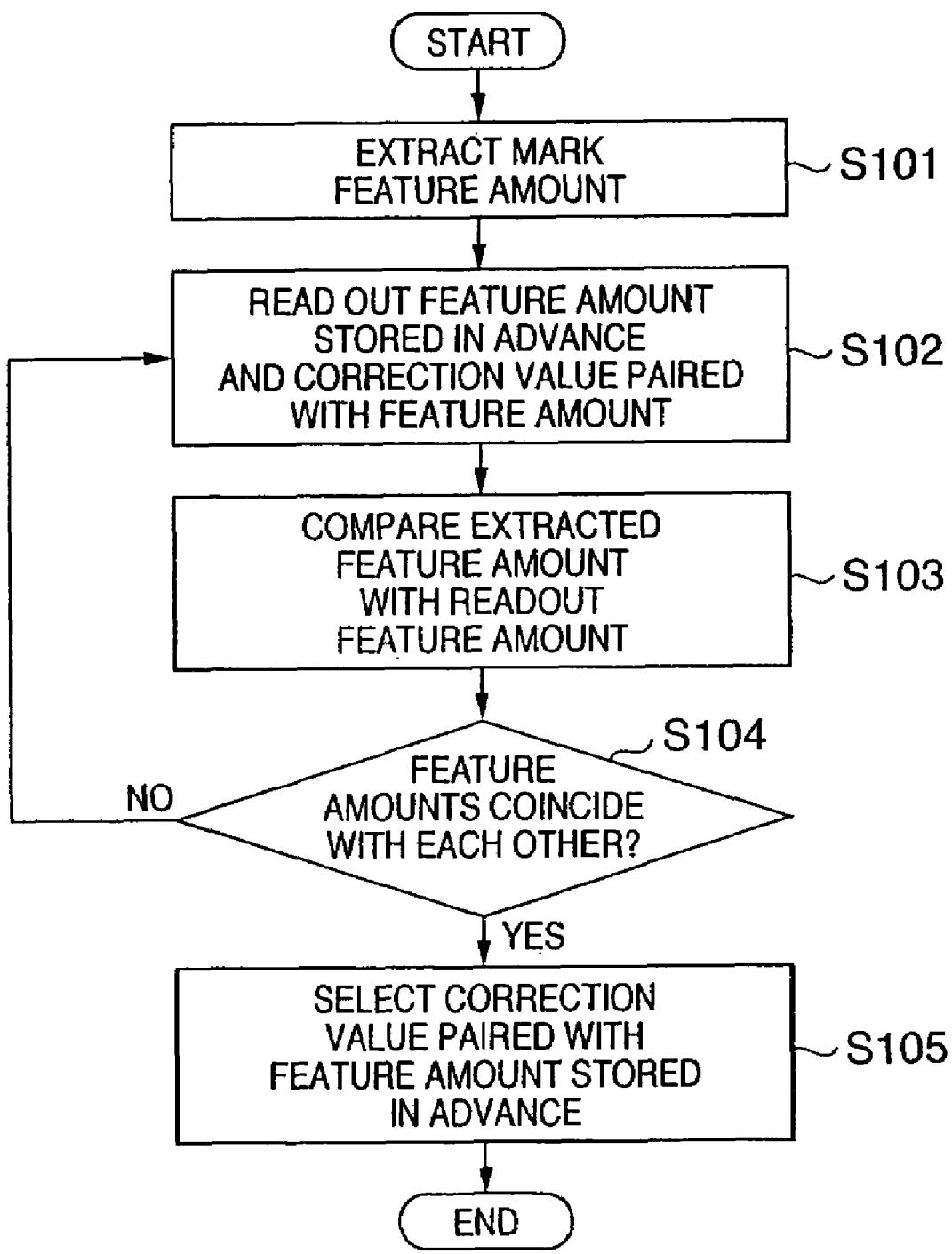
FIG. 8 is a flow chart showing a position correction amount calculation process procedure of the first embodiment.
Figure 9:
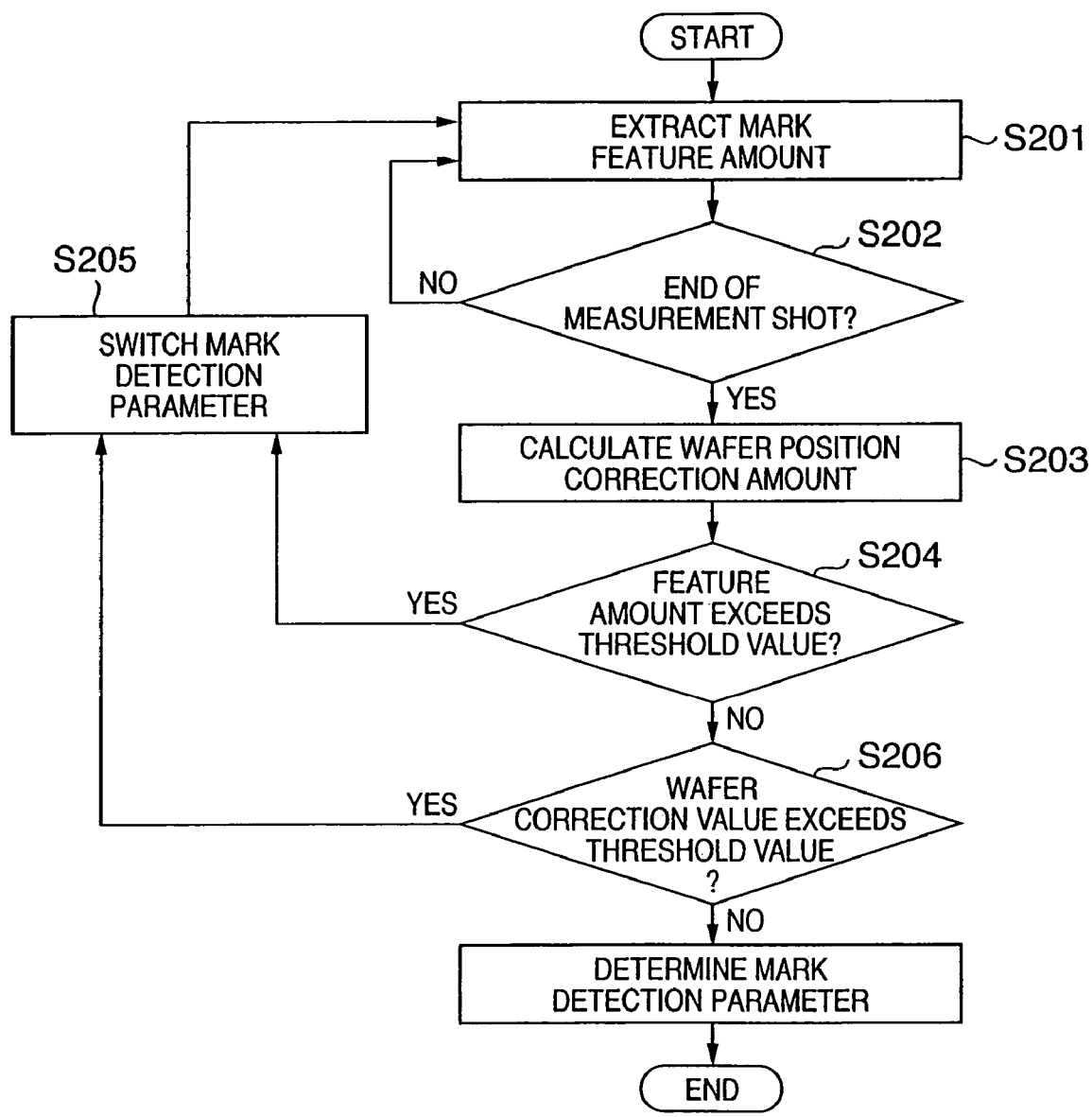
FIG. 9 is a flow chart showing a mark detection parameter selection process procedure of the second embodiment.

In addition, the embodiments are characterized by comprising the position correction value calculation step of calculating a position data correction value in advance on the basis of the measurement accuracy degradation amount and a past exposure result, as shown in FIG. 8, or the alignment process parameter selection step of selecting an optimum process parameter from the measurement accuracy degradation amount, as shown in FIG. 9.

The embodiments of the present invention will be described below in detail.

First Embodiment

FIG. 1 is a flow chart showing alignment and exposure process procedures according to the first embodiment.

In the example to be described below, of the above-described detection methods, the third detection method of detecting a degradation in measurement accuracy by comparing the measured contrast of a mark portion and that of a non-mark portion is used.

First, in step S1, a wafer that is roughly aligned is placed on a wafer stage by a wafer transfer unit. In step S2, the wafer stage is driven such that an alignment mark formed in the first measurement shot falls within the visual range of the alignment optical system. In step S3, the position of the alignment mark is measured. More specifically, the image of the alignment mark is photoelectrically converted by an image sensing unit and then converted into a two-dimensional digital signal sequence by an A/D conversion unit. A process window is set by an integration unit. Addition processing is executed in one direction in the window, thereby converting the two-dimensional image signal into a one-dimensional digital signal sequence. The digital signal of each alignment mark is compared by a position detection unit with a template pattern stored in advance. A signal sequence having a high similarity to the template pattern is output to a coordinate position control unit. This output signal indicates an alignment mark position with reference to the image sensing surface of the image sensing unit. For this reason, the control unit calculates a shift amount of the alignment mark with respect to the reticle on the basis of the relative position between the image sensing unit and the reticle, which is obtained in advance. With these processes, the X-direction positional shift amount of the first measurement shot is measured. Next, the control unit drives the wafer stage such that the Y-direction measurement alignment mark in the first measurement shot falls within the visual range of the Y-direction alignment optical system. The Y-direction positional shift amount is measured in accordance with the same procedure as in X-direction measurement. Thus, the alignment mark position in the first measurement shot is measured.

In step S4, the feature amount of the alignment mark is calculated from the digital signal sequence detected in step S3. More specifically, the contrast of a mark portion and that of a non-mark portion are measured, as shown in FIG. 5. For example, the contrast of a mark portion and that of a non-mark portion are calculated on the basis of the difference between the maximum and minimum values of each portion or the dispersion value of the value of each portion.

In step S5, a correction value is calculated on the basis of the contrast of a mark portion and that of a non-mark portion, which are measured in step S4. More specifically, the above contrast value serving as the feature amount of the alignment mark (extracted feature amount) is compared with a plurality of contrast values (readout feature amounts) stored in advance. Each of the plurality of contrast values (readout feature amounts) is paired with a corresponding correction value and stored. Then, the readout feature amount (contrast value) that coincides with the extracted feature amount (contrast value) is determined. A correction value corresponding to the readout feature amount that coincides with the extracted feature amount is selected as a correction amount (steps S102 to S105 in FIG. 8). The relationship between the readout feature amount and the correction value is obtained by, e.g., obtaining the correlation between the contrast value and the residual in previous alignment and calculating the degree of correction of the measurement value from the correlation.

In more detail, regarding FIG. 8, step S101 represents a step of extracting a mark feature amount, which then proceeds to step S102. Step 102 shows reading out a feature amount stored in advance and correcting a value paired with the feature amount, which then proceeds to step S103. Step 103 shows an extracted feature amount being compared with a read out feature amount, leading to step S104 in which a determination is made as to whether the feature amounts coincide with each other. If NO, the flow proceeds back to step S102. If YES, the flow proceeds to step S105, which represents selecting a correction paired with a feature amount stored in advance. After step S105, the processing ends.

In a similar way, steps S2 to S5 are repeated to measure the measurement positional shift amount of the alignment mark in each measurement shot until it is determined in step S6 that a predetermined number of measurement shots are measured.

Next, in steps S7 and S8, the wafer is relatively aligned to the reticle in accordance with the following procedure on the basis of the positional shift amount in each measurement shot measured in step S3 and the correction value calculated in step S5. More specifically, statistical calculation is performed on the basis of a corrected positional shift amount obtained by subtracting the correction value in each shot, which is calculated in step S5, from the alignment amount in each measurement shot, which is measured in step S3. A wafer position correction amount, i.e., X- and Y-direction parallel shifts, X- and Y-direction extensions, and X- and Y-axis rotational shifts for alignment are thus calculated. In step S8, the wafer stage is driven under the control of the control unit on the basis of the wafer position correction amount obtained in step S7, thereby exposing all shots formed on the wafer.

In step S9, the wafer is unloaded from the wafer stage by the wafer transfer unit.

The operation in steps S1 to S9 is repeated until it is determined in step S10 that exposure processing is ended for all wafers to be processed.

In this embodiment, position correction is executed for each measurement cycle. For the correction values stored or waveform evaluation values calculated, determination may be done individually for all measurement marks, for the same mark on the reticle in exposing a measurement wafer, separately for each of the wafer correction mark and shot correction mark, or for each correction component.

The method of this embodiment may be used together with the method of the second embodiment to be described later. In the above-described method, the third detection method is used. However, the first or second detection method may be used.

The position data may be corrected for the same measurement mark on the reticle.

The position data may be corrected separately for each of the wafer correction mark and shot correction mark.

The position data may be corrected for each correction component.

Second Embodiment

FIG. 2 is a flow chart showing alignment and exposure process procedures according to the second embodiment. In the example to be described below, of the above-described detection methods, the third detection method of detecting a degradation in measurement accuracy by comparing the measured contrast of a mark portion and that of a non-mark portion is used.

First, in step S21, a wafer that is roughly aligned is placed on a wafer stage by a wafer transfer unit. In step S22, the wafer stage is driven such that an alignment mark formed in the first measurement shot falls within the visual range of the alignment optical system.

In step S23, the position of the alignment mark is measured. More specifically, the image of the alignment mark is photoelectrically converted by an image sensing unit and then converted into a two-dimensional digital signal sequence by an A/D conversion unit. A process window is set by an integration unit. Addition processing is executed in one direction in the window, thereby converting the two-dimensional image signal into a one-dimensional digital signal sequence. The digital signal of each alignment mark is compared by a position detection unit with a template pattern stored in advance. A signal sequence having a high similarity to the template pattern is output to a coordinate position control unit. This output signal indicates an alignment mark position with reference to the image sensing surface of the image sensing unit. For this reason, the control unit calculates a shift amount of the alignment mark with respect to the reticle on the basis of the relative position between the image sensing unit and the reticle, which is obtained in advance. With these processes, the X-direction positional shift amount of the first measurement shot is measured. Next, the control unit drives the wafer stage such that the Y-direction measurement alignment mark in the first measurement shot falls within the visual range of the Y-direction alignment optical system. The Y-direction positional shift amount is measured in accordance with the same procedure as in X-direction measurement. Thus, the alignment mark position in the first measurement shot is measured.

In step S24, the feature amount of the alignment mark is calculated from the digital signal sequence detected in step S23. More specifically, the contrast of a mark portion and that of a non-mark portion shown in FIG. 6 are measured (corresponding to step S201 in FIG. 9). For example, the contrast of a mark portion and that of a non-mark portion are calculated on the basis of the difference between the maximum and minimum values of each portion or the dispersion value of the value of each portion.

In a similar way, steps S22 to S24 are repeated to measure the measurement positional shift amount in each measurement shot until it is determined in step S25 that a predetermined number of measurement shots are measured.

In step S26, the wafer is relatively aligned to the reticle in accordance with the following procedure on the basis of the positional shift amount in each measurement shot measured in step S23. More specifically, statistical calculation is performed on the basis of an alignment amount in each measurement shot, which is measured in step S23. A wafer position correction amount, i.e., X- and Y-direction parallel shifts, X- and Y-direction extensions, X- and Y-axis rotational shifts, and higher-order alignment shift for alignment are thus calculated (corresponding to step S203 in FIG. 9). The shape correction amount in each shot may be calculated, like the wafer position correction amount.

In step S27, the parameter to be used in step S23 is switched, and steps S22 to S26 (corresponding to steps S201 to S206 in FIG. 9) are repeated until each mark feature amount obtained in step S24 exceeds a predetermined threshold value in step S27. If YES in step S27, the parameter when the feature amount exceeds the threshold value is selected in step S29. This parameter is used in step S30. If the feature amount does not exceed the threshold value even when the parameter is changed a predetermined number of times, the shot to be measured may be changed. For the comparison and determination of the feature amount and threshold value, determination may be done individually for all measurement marks, for the same mark on the reticle in exposing a measurement wafer, separately for each of the wafer correction mark and shot correction mark, or for each correction component.

In step S30, the wafer stage is driven under the control of the control unit on the basis of the wafer position correction amount obtained in step S26, thereby exposing all shots formed on the wafer.

In step S31, the wafer is unloaded from the wafer stage by the wafer transfer unit.

The operation in steps S21 to S31 is repeated until it is determined in step S32 that exposure processing is ended for all wafers to be processed.

The method of this embodiment may be used together with the method of the first embodiment. In the above-described method, the third detection method is used. However, the first or second detection method may be used.

As described above, according to the above embodiment, the mark feature amount is calculated on the basis of the information in detecting the mark. In addition, an alignment correction value or a parameter suitable for mark detection is calculated from the mark feature amount. For these reasons, more accurate alignment than before can be executed. Hence, the productivity of an exposure apparatus or the like can be increased.

A semiconductor device manufacturing process using an exposure apparatus using the above alignment method will be described next.

Figure 11:
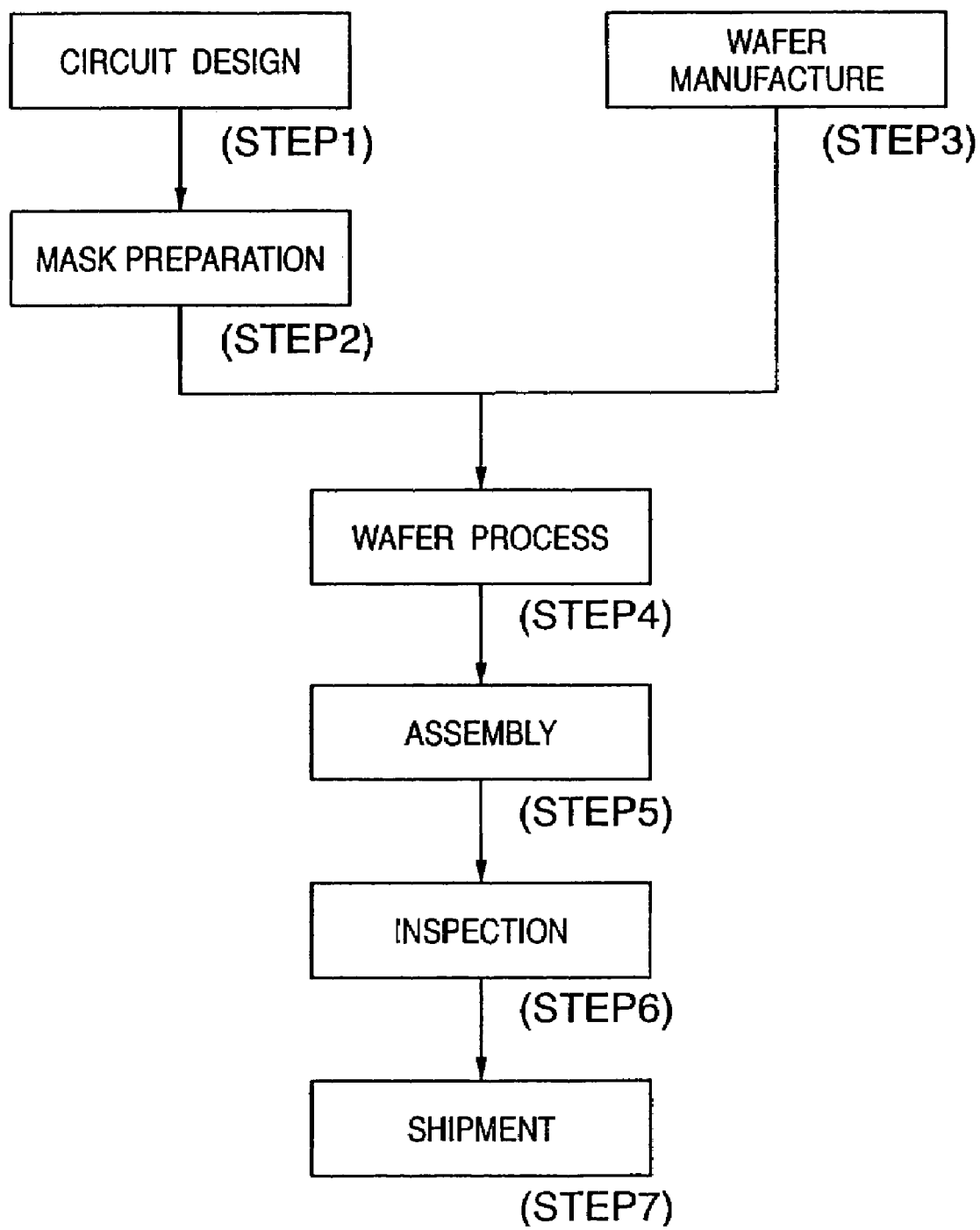
FIG. 11 is a flow chart of the overall process of manufacturing a semiconductor device.

FIG. 11 shows the overall flow of the process of manufacturing a semiconductor device.

In step 1 (circuit design), the circuit of a semiconductor device is designed. In step 2 (mask preparation), a mask is prepared on the basis of the designed circuit pattern. In step 3 (wafer manufacture), a wafer is manufactured using a material such as silicon. In step 4 (wafer process), called a preprocess, an actual circuit is formed on the wafer by lithography using the mask and wafer.

In step 5 (assembly), called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and shipped in step 7.

Figure 12:
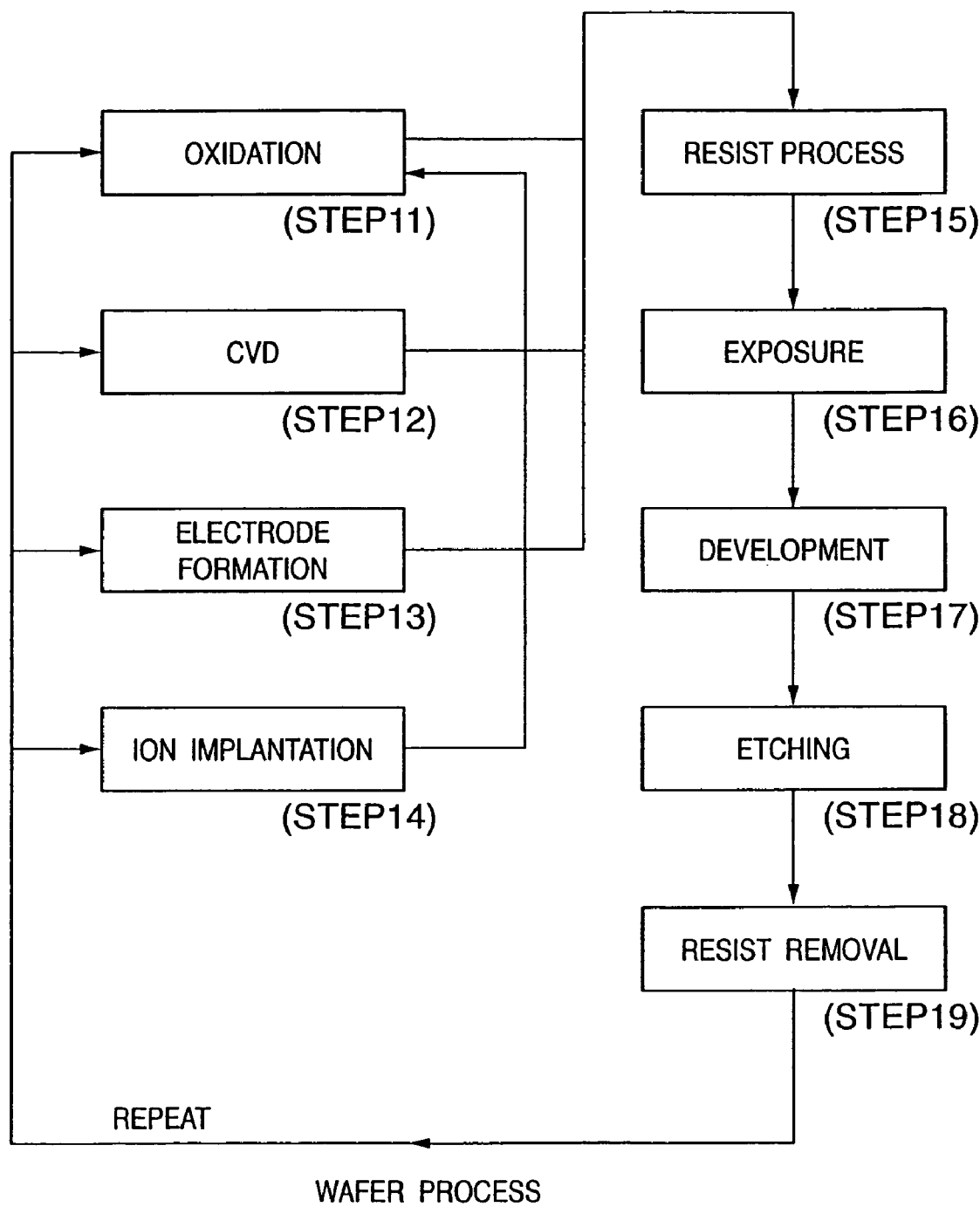
FIG. 12 is a flow chart of the overall manufacturing process of a semiconductor device.

FIG. 12 shows the detailed flow of the wafer process.

In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the circuit pattern is transferred to the wafer by the above exposure apparatus. In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer.

As described above, according to the above embodiments, highly accurate alignment can be executed using only one kind of alignment detection apparatus.

The present invention is not limited to the above embodiments and various changes and modifications can be made within the spirit and scope of the present invention. Therefore, to apprise the public of the scope of the present invention, the following claims are made.

What is claimed is:

1. A method of aligning an object, comprising steps of:
   detecting an image of a mark on the object with respect to each of a plurality of areas on the object;
   obtaining a position of the mark based on the detected image with respect to each image detected in said detecting step;
   extracting a feature of the mark based on the detected image with respect to each image detected in said detecting step;
   determining a correction value based on previously prepared information to relate the extracted feature to the correction value, with respect to each position obtained in said obtaining step, the correction value being a value to be subtracted from a position obtained in said obtaining step;
   correcting a position obtained in said obtaining step by subtracting the correction value from the position obtained in said obtaining step with respect to each position obtained in said obtaining step;

calculating a position of each of the plurality of areas based on positions corrected in said correcting step; and aligning the object based on a position of each of the plurality of areas calculated in said calculating step.

2. A method according to claim 1, wherein the feature extracted in said extracting step concerns at least one of a contrast of the mark, an interval between portions of the mark, and asymmetry of a portion of the mark.

3. A method according to claim 1, wherein the correction value is previously prepared with respect to one of (i) each mark, (ii) each kind of the mark, and (iii) each position component of the object.

4. An exposure apparatus for transferring a pattern to an object, said apparatus comprising:

a unit which detects an image of a mark on the object with respect to each of a plurality of areas on the object;

a unit which obtains a position of the mark based on the detected image with respect to each image detected by said detecting unit;

a unit which extracts a feature of the mark based on the detected image with respect to each image detected by said detecting unit;

a unit which determines a correction value based on previously prepared information to relate the extracted feature to the correction value, with respect to each position obtained by said obtaining unit, the correction value being a value to be subtracted from a position obtained in said obtaining step;

a unit which corrects a position obtained in said obtaining step by subtracting the correction value from the position obtained in said obtaining step with respect to each position obtained by said obtaining unit; and a unit which calculates a position of each of a plurality of areas on the object based on positions corrected by said correcting unit.

5. A method of manufacturing a device, said method comprising steps of:

detecting an image of a mark on an object with respect to each of a plurality of areas on the object;

obtaining a position of the mark based on the detected image with respect to each image detected in said detecting step;

extracting a feature of the mark based on the detected image with respect to each image detected in said detecting step;

determining a correction value based on previously prepared information to relate the extracted feature to the correction value, with respect to each position obtained in said obtaining step, the correction value being a value to be subtracted from a position obtained in said obtaining step;

correcting a position obtained in said obtaining step by subtracting the correction value from the position obtained in said obtaining step with respect to each position obtained in said obtaining step;

calculating a position of each of a plurality of areas on the object based on positions corrected in said correcting step; and transferring a pattern to the object based on each position calculated in said calculating step.

* * * * *